(12) United States Patent
Moon et al.

(10) Patent No.: US 11,342,534 B2
(45) Date of Patent: May 24, 2022

(54) ENCAPSULATION FILM

(71) Applicant: LG CHEM, LTD., Seoul (KR)

(72) Inventors: Jung Ok Moon, Daejeon (KR); Hyun Jee Yoo, Daejeon (KR); Yeong Bong Mok, Daejeon (KR); Se Woo Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1 day.

(21) Appl. No.: 16/620,458

(22) PCT Filed: Jun. 11, 2018

(86) PCT No.: PCT/KR2018/006591
§ 371 (c)(1),
(2) Date: Dec. 6, 2019

(87) PCT Pub. No.: WO2018/226077
PCT Pub. Date: Dec. 13, 2018

(65) Prior Publication Data
US 2020/0127230 A1      Apr. 23, 2020

(30) Foreign Application Priority Data
Jun. 9, 2017 (KR) .......................... 10-2017-0072500

(51) Int. Cl.
*H01L 51/52* (2006.01)
(52) U.S. Cl.
CPC ............................ *H01L 51/5253* (2013.01)

(58) Field of Classification Search
CPC .................................................. H01L 51/5253
See application file for complete search history.

(56) References Cited

U.S. PATENT DOCUMENTS

| | | | |
|---|---|---|---|
| 6,815,887 B2 * | 11/2004 | Lee | ............ H01L 51/5253 |
| | | | 313/512 |
| 7,973,477 B2 | 7/2011 | Miura et al. | |
| 9,359,527 B2 | 6/2016 | Murota | |
| 9,806,287 B2 | 10/2017 | Yoo et al. | |
| 9,871,224 B2 | 1/2018 | Kim et al. | |
| 10,084,155 B2 | 9/2018 | Cui | |
| 10,103,353 B2 | 10/2018 | Cho et al. | |
| 10,680,199 B2 | 6/2020 | Kim et al. | |
| 2005/0116638 A1 | 6/2005 | Chung et al. | |
| 2016/0088756 A1 * | 3/2016 | Ramadas | ............ H01L 51/5259 |
| | | | 361/728 |
| 2016/0118620 A1 * | 4/2016 | Yoo | ............ H01L 51/5259 |
| | | | 257/40 |

(Continued)

FOREIGN PATENT DOCUMENTS

| | | |
|---|---|---|
| CN | 1638537 | 7/2005 |
| CN | 101073136 | 11/2007 |

(Continued)

*Primary Examiner* — Yu-Hsi D Sun
(74) *Attorney, Agent, or Firm* — Dentons US LLP

(57) ABSTRACT

The present application relates to an encapsulation film, a method for producing the same, an organic electronic device comprising the same, and a method for preparing an organic electronic device using the same, which allows forming a structure capable of blocking moisture or oxygen introduced into an organic electronic device from the outside, and can prevent occurrence of bright spots of the organic electronic device.

19 Claims, 3 Drawing Sheets

(56) References Cited

U.S. PATENT DOCUMENTS

| | | |
|---|---|---|
| 2017/0155086 A1 | 6/2017 | Kang |
| 2017/0170427 A1 | 6/2017 | Yoo et al. |

FOREIGN PATENT DOCUMENTS

| | | |
|---|---|---|
| CN | 104903090 | 9/2015 |
| CN | 106328825 A | 1/2017 |
| CN | 106463648 A | 2/2017 |
| JP | 2014167893 | 9/2014 |
| JP | 2014203707 | 10/2014 |
| JP | 2016-520247 | 7/2016 |
| JP | 2017-512363 | 5/2017 |
| JP | 2017-513205 | 5/2017 |
| KR | 10-20140136900 | 12/2014 |
| KR | 10-20160101695 | 8/2016 |
| KR | 10-2017-0051600 | 5/2017 |
| KR | 10-20170062240 | 6/2017 |
| TW | 201700278 | 1/2017 |
| WO | 2016-133364 | 8/2016 |

* cited by examiner

[Figure 1]
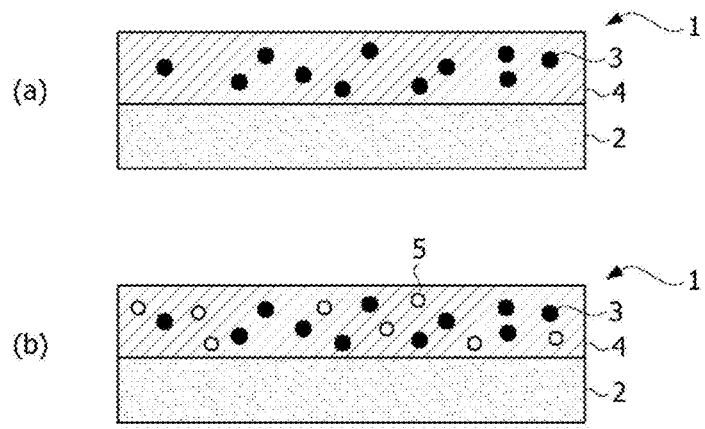
[Figure 2]
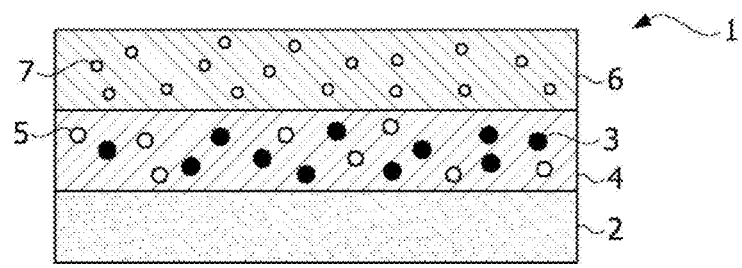
[Figure 3]
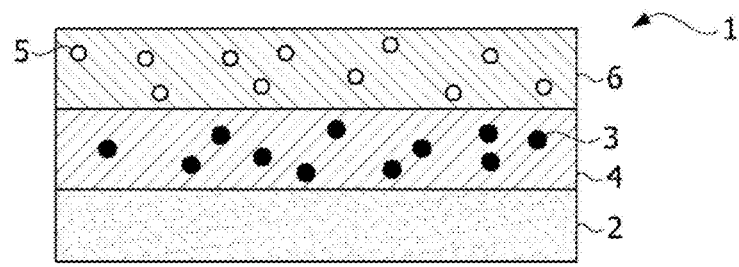

[Figure 4]
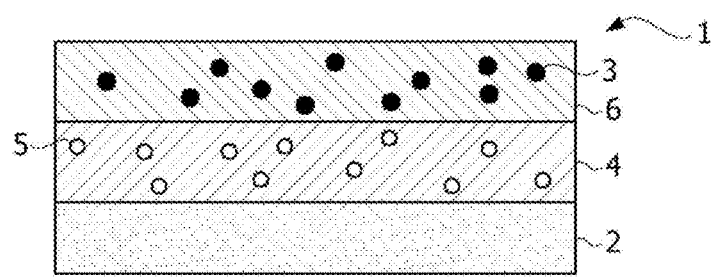
[Figure 5]
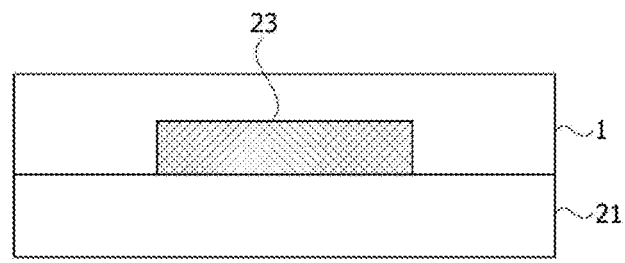

[Figure 6]
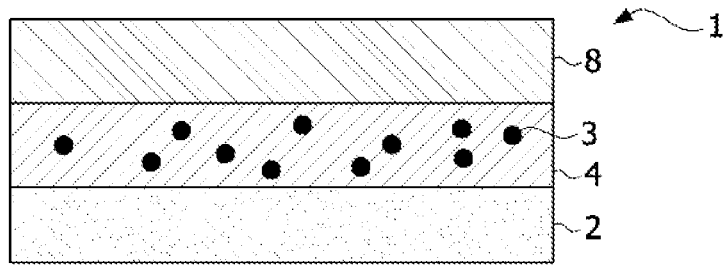
[Figure 7]
(a)
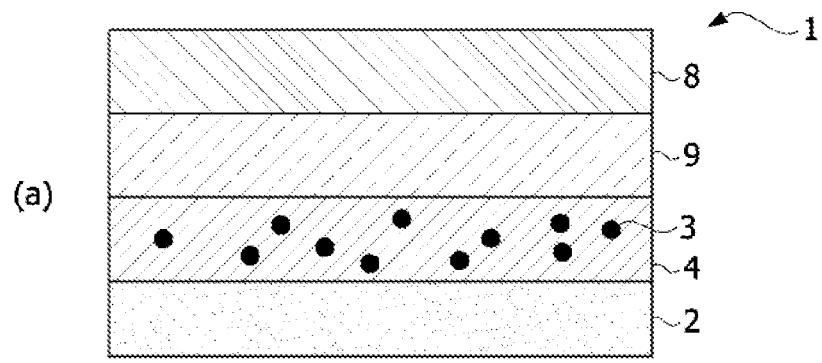
(b)
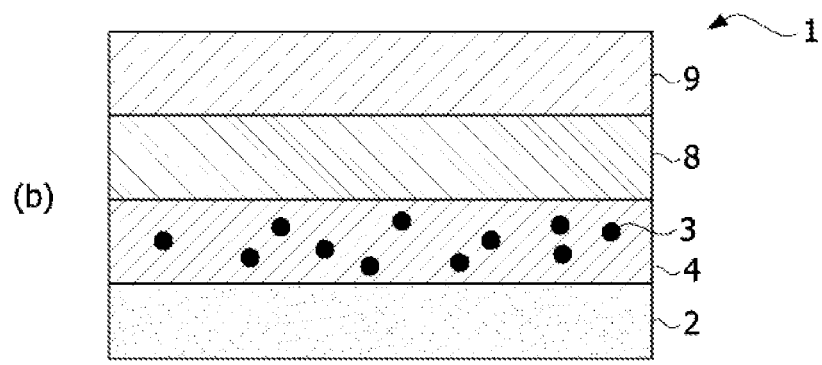
[Figure 8]
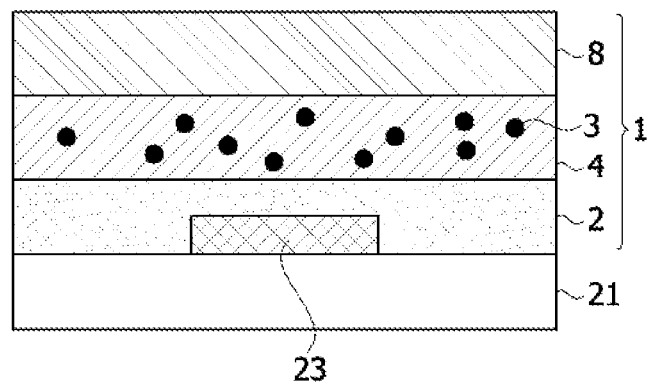

ENCAPSULATION FILM

CROSS-REFERENCE TO RELATED APPLICATIONS

The present application is a National Stage Application of International Application No. PCT/KR2018/006591 filed on Jun. 11, 2018, which claims the benefit of priority based on Korean Patent Application No. 10-2017-0072500 filed on Jun. 9, 2017, the disclosure of which is incorporated herein by reference in its entirety.

Technical Field

The present application relates to an encapsulation film, an organic electronic device comprising the same and a method for preparing an organic electronic device using the same.

Background

An organic electronic device (OED) means a device comprising an organic material layer that generates alternate current of charges using holes and electrons, and an example thereof can include a photovoltaic device, a rectifier, a transmitter and an organic light emitting diode (OLED), and the like.

The organic light emitting diode (OLED) among the above organic electronic devices has less power consumption and faster response speed than existing light sources, and is advantageous for thinning of a display device or illumination. In addition, the OLED has spatial usability and thus is expected to be applied in various fields covering various portable devices, monitors, notebooks, and TVs.

In commercialization and application expansion of the OLED, the most important problem is a durability problem. Organic materials and metal electrodes, and the like contained in the OLED are very easily oxidized by external factors such as moisture. In addition, there is also a problem that OLED bright spots occur by outgases that can occur inside the OLED device. That is, products containing OLEDs are highly sensitive to environmental factors. Accordingly, various methods have been proposed in order to effectively block infiltration of oxygen or moisture from the outside to the organic electronic device such as the OLED and to suppress outgases generated in the inside.

Technical Problem

The present application provides an encapsulation film which allows forming a structure capable of blocking moisture or oxygen introduced into an organic electronic device from the outside, and can prevent occurrence of bright spots of the organic electronic device.

Technical Solution

The present application relates to an encapsulation film. The encapsulation film can be applied to sealing or encapsulating organic electronic devices such as, for example, OLEDs.

In this specification, the term "organic electronic device" means an article or device having a structure comprising an organic material layer that generates alternate current of charges using holes and electrons between a pair of electrodes facing each other, and an example thereof can include, but is not limited to, a photovoltaic device, a rectifier, a transmitter and an organic light emitting diode (OLED), and the like. In one example of the present invention, the organic electronic device can be an OLED.

An exemplary encapsulation film for an organic electronic element can comprise an encapsulation layer. The encapsulation layer can encapsulate the entire surface of an organic electronic element formed on a substrate. In one example, the encapsulation film can comprise a bright spot inhibitor. In one embodiment, as in FIG. 1(a), the encapsulation film can comprise at least two encapsulation layers, where the encapsulation layer can comprise a first layer (2) contacting the organic electronic element and a second layer (4) not contacting the organic electronic element. In addition, the second layer (4) can comprise a bright spot inhibitor (3) having adsorption energy for outgases of 0 eV or less as calculated by the density functional theory. The lower limit value of the adsorption energy is not particularly limited, but can be −20 eV. The type of the outgas is not particularly limited, but can include H atoms, $H_2$ molecules and/or $NH_3$. As the encapsulation film comprises the bright spot inhibitor, the present application can block moisture introduced into the organic electronic element and simultaneously prevent bright spots due to outgas occurring in the organic electronic device. In addition, by comprising the bright spot inhibitor in the second layer not contacting the organic electronic element, the encapsulation film of the present application can prevent damage to the organic electronic element according to stress concentration due to the bright spot inhibitor. In view of the above, the first layer may or may not comprise the bright spot inhibitor in an amount of 15% or less based on the mass of the total bright spot inhibitor in the encapsulation film. In addition, the layer that does not contact the organic electronic element, excluding the first layer, can comprising 85% or more of the bright spot inhibitor based on the mass of the total bright spot inhibitor in the encapsulation film. That is, in the present application, the other encapsulation layer not contacting the organic electronic element can comprise the bright spot inhibitor in a higher content, as compared with the first layer contacting the organic electronic element, thereby preventing physical damage applied to the element while realizing while realizing moisture barrier properties and bright spot prevention properties of the film.

In an embodiment of the present application, the adsorption energy between the bright spot inhibitor and the bright spot-causing atoms or molecules can be calculated through electronic structure calculation based on the density functional theory. The above calculation can be performed by a method known in the art. For example, in the present application, after making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/A or less. A series of calculation was performed through VASP as a commercially available code.

The material of the bright spot inhibitor is not limited as long as the material is a material having the effect of preventing the bright spots on the panel of the organic electronic device when the encapsulation film is applied to the organic electronic device. For example, the bright spot inhibitor can be a material capable of adsorbing a material exemplified by, for example, $H_2$ gas, ammonia ($NH_3$) gas, $H^+$, $NH^{2+}$, $NHR_2$ or $NH_2R$ as outgas generated from an inorganic deposition layer of silicon oxide, silicon nitride, or silicon oxynitride deposited on an electrode of an organic electronic element. Here, R can be an organic group, and for example, can be exemplified by an alkyl group, an alkenyl group, an alkynyl group and the like, but is not limited thereto.

In one example, the material of the bright spot inhibitor is not limited as long as it satisfies the above adsorption energy value, which can be a metal or a non-metal. The bright spot inhibitor can comprise, for example, Li, Ni, Ti, Rb, Be, Mg, Ca, Sr, Ba, Al, Zn, In, Pt, Pd, Fe, Cr, Si, or a combination thereof, can comprise an oxide or a nitride of the material, and can comprise an alloy of the material. In one example, the bright spot inhibitor can comprise nickel particles, nickel oxide particles, titanium nitride, titanium-based alloy particles of iron-titanium, manganese-based alloy particles of iron-manganese, magnesium-based alloy particles of magnesium-nickel, rare earth-based alloy particles, zeolite particles, silica particles, carbon nanotubes, graphite, aluminophosphate molecular sieve particles or meso silica particles. In the encapsulation film, the bright spot inhibitor can be included in an amount of 3 to 150 parts by weight, 6 to 143 parts by weight, 8 to 131 parts by weight, 9 to 123 parts by weight, 10 to 116 parts by weight, 10 to 95 parts by weight, 10 to 50 parts by weight, or 10 to 35 parts by weight, relative to 100 parts by weight of the resin component in the encapsulation layer. The present application can realize the bright spot prevention of the organic electronic device while improving adhesiveness and durability of the film in the above content range. In addition, the bright spot inhibitor can have a particle diameter in a range of 10 nm to 30 μm, 50 nm to 21 μm, 105 nm to 18 μm, 110 nm to 12 μm, 120 nm to 9 μm, 140 nm to 4 μm, 150 nm to 2 μm, 180 nm to 900 nm, 230 nm to 700 nm or 270 nm to 400 nm. By comprising the bright spot inhibitor, the present application can realize moisture barrier properties and endurance reliability of the encapsulation film together while efficiently adsorbing hydrogen generated in the organic electronic device. In this specification, the term resin component can be an encapsulation resin and/or a binder resin, which are described below.

As described above, the encapsulation layer can have two or more multi-layered structures. When two or more layers constitute the encapsulation layer, the composition of each layer in the encapsulation layer can be the same or different. In one example, the encapsulation layer can comprise an encapsulation resin and/or a moisture adsorbent, and the encapsulation layer can be a pressure-sensitive adhesive layer or an adhesive layer.

As shown in FIG. 1, the encapsulation layer (2, 4) can comprise a first layer (2) and a second layer (4), and the second layer (4) of the encapsulation layer can comprise a bright spot inhibitor (3). In addition, as in FIG. 1(b), the second layer can comprise the bright spot inhibitor (3) and the moisture adsorbent (5) together. Furthermore, the encapsulation layer is not limited to the above, which can be formed in a three-layered structure as shown in FIGS. 3 and 4. In the encapsulation film of the present application, when the encapsulation layer has a three-layered structure, at least one encapsulation layer can comprise a bright spot inhibitor and/or a moisture adsorbent. For example, the bright spot inhibitor and the moisture adsorbent can be included in one encapsulation layer together or can be present in separate encapsulation layers, respectively. However, when the encapsulation film is applied on the organic electronic element, the first layer (2), which is an encapsulation layer facing the organic electronic element, may not comprise the bright spot inhibitor and the moisture adsorbent, or can also comprise a small amount thereof, if any.

In an embodiment of the present invention, the encapsulation resin can have a glass transition temperature of less than 0° C., less than –10° C., less than –30° C., less than –50° C., or less than –60° C. Here, the glass transition temperature can be a glass transition temperature after curing, and in one embodiment, it can mean a glass transition temperature after irradiation with ultraviolet light of about 1 J/cm$^2$ or more; or a glass transition temperature after further performing thermosetting after ultraviolet irradiation.

In one example, the encapsulation resin can comprise a styrene resin or elastomer, a polyolefin resin or elastomer, other elastomers, a polyoxyalkylene resin or elastomer, a polyester resin or elastomer, a polyvinyl chloride resin or elastomer, a polycarbonate resin or elastomer, a polyphenylene sulfide resin or elastomer, a mixture of hydrocarbons, a polyamide resin or elastomer, an acrylate resin or elastomer, an epoxy resin or elastomer, a silicone resin or elastomer, a fluorine resin or elastomer or a mixture thereof, and the like.

Here, as the styrene resin or elastomer, for example, styrene-ethylene-butadiene-styrene block copolymer (SEBS), styrene-isoprene-styrene block copolymer (SIS), acrylonitrile-butadiene-styrene block copolymer (ABS), acrylonitrile-styrene-acrylate block copolymer (ASA), styrene-butadiene-styrene block copolymer (SBS), styrene homopolymer or a mixture thereof can be exemplified. As the olefin resin or elastomer, for example, a high density polyethylene resin or elastomer, a low density polyethylene resin or elastomer, a polypropylene resin or elastomer or a mixture thereof can be exemplified. As the elastomer, for example, an ester thermoplastic elastomer, an olefin elastomer, a silicone elastomer, an acrylic elastomer or a mixture thereof, and the like can be used. In particular, as the olefin thermoplastic elastomer, a polybutadiene resin or elastomer or a polyisobutylene resin or elastomer, and the like can be used. As the polyoxyalkylene resin or elastomer, for example, a polyoxymethylene resin or elastomer, a polyoxyethylene resin or elastomer or a mixture thereof, and the like can be exemplified. As the polyester resin or elastomer, for example, a polyethylene terephthalate resin or elastomer, a polybutylene terephthalate resin or elastomer or a mixture thereof, and the like can be exemplified. As the polyvinyl chloride resin or elastomer, for example, polyvinylidene chloride and the like can be exemplified. As the mixture of hydrocarbons, for example, hexatriacotane or paraffin, and the like can be exemplified. As the polyamide resin or elastomer, for example, nylon and the like can be exemplified. As the acrylate resin or elastomer, for example, polybutyl (meth)acrylate and the like can be exemplified. As the epoxy resin or elastomer, for example, bisphenol types such as bisphenol A type, bisphenol F type, bisphenol S type and a hydrogenated product thereof; novolak types such as phenol novolak type or cresol novolak type; nitrogen-containing cyclic types such as triglycidyl isocyanurate type or hydantoin type; alicyclic types; aliphatic types; aromatic types such as naphthalene type and biphenyl type; glycidyl types such as glycidyl ether type, glycidyl amine type and glycidyl ester type; dicyclo types such as dicyclopentadiene type; ester types; ether ester types or a mixture thereof, and the like can be exemplified. As the silicone resin or elastomer, for example, polydimethylsiloxane and the like can be exemplified. In addition, as the fluororesin or elastomer, a polytrifluoroethylene resin or elastomer, a polytetrafluoroethylene resin or elastomer, a polychlorotrifluoroethylene resin or elastomer, a polyhexafluoropropylene resin or elastomer, polyfluorinated vinylidene, polyfluorinated vinyl, polyfluorinated ethylene propylene or a mixture thereof, and the like can be exemplified.

The resins or elastomers listed above can be also used, for example, by being grafted with maleic anhydride or the like, by being copolymerized with other resins or elastomers through monomers for producing resins or elastomers, and by being modified with other compounds. An example of other compounds above can include carboxyl-terminal butadiene-acrylonitrile copolymers and the like.

In one example, the encapsulation layer can comprise, but is not limited to, the olefin elastomer, the silicone elastomer or the acrylic elastomer, and the like among the above-mentioned types as the encapsulation resin.

In one embodiment of the present invention, the encapsulation resin can be an olefin resin. In one example, the olefin resin can be a homopolymer of a butylene monomer; a copolymer obtained by copolymerizing a butylene monomer and another polymerizable monomer; a reactive oligomer using a butylene monomer; or a mixture thereof. The butylene monomer can include, for example, 1-butene, 2-butene or isobutylene.

Other monomers polymerizable with the butylene monomers or derivatives can include, for example, isoprene, styrene, or butadiene and the like. By using the copolymer, physical properties such as processability and degree of cross-linking can be maintained and thus heat resistance of the adhesive itself can be secured when applied to organic electronic devices.

In addition, the reactive oligomer using the butylene monomer can comprise a butylene polymer having a reactive functional group. The oligomer can have a weight average molecular weight ranging from 500 to 5,000. Furthermore, the butylene polymer can be coupled to another polymer having a reactive functional group. The other polymer can be, but is not limited to, alkyl (meth)acrylate. The reactive functional group can be a hydroxy group, a carboxyl group, an isocyanate group or a nitrogen-containing group. Also, the reactive oligomer and the other polymer can be cross-linked by a multifunctional cross-linking agent, and the multifunctional cross-linking agent can be at least one selected from the group consisting of an isocyanate cross-linking agent, an epoxy cross-linking agent, an aziridine cross-linking agent and a metal chelate cross-linking agent.

In one example, the encapsulation resin of the present application can be a copolymer of a diene and an olefinic compound containing one carbon-carbon double bond. Here, the olefinic compound can include butylene or the like, and the diene can be a monomer capable of polymerizing with the olefinic compound, and can include, for example, isoprene or butadiene and the like. For example, the copolymer of an olefinic compound containing one carbon-carbon double bond and a diene can be a butyl rubber.

In the encapsulation layer, the resin or elastomer component can have a weight average molecular weight (Mw) to an extent such that the pressure-sensitive adhesive composition can be formed into a film shape. For example, the resin or elastomer can have a weight average molecular weight of about 100,000 to 2,000,000, 120,000 to 1,500,000, or 150,000 to 1,000,000 or so. The term weight average molecular weight herein means a value converted to standard polystyrene measured by GPC (gel permeation chromatography). However, the resin or elastomer does not necessarily have the above-mentioned weight average molecular weight. For example, in the case where the molecular weight of the resin or elastomer component is not in a level enough to form a film, a separate binder resin can be blended into the pressure-sensitive adhesive composition.

In another embodiment, the encapsulation resin according to the present application can be a curable resin. When the encapsulation resin is a curable resin, the encapsulation resin can be a resin having a glass transition temperature of 85° C. or higher after curing. The glass transition temperature can be a glass transition temperature after photocuring or thermosetting the encapsulation resin. The specific kind of the curable resin that can be used in the present invention is not particularly limited, and for example, various thermosetting or photo-curable resins known in this field can be used. The term "thermosetting resin" means a resin that can be cured through an appropriate heat application or aging process, and the term "photo-curable resin" means a resin that can be cured by irradiation of electromagnetic waves. Furthermore, the curable resin can be a dual curable resin including both thermosetting and photocuring properties.

In the present application, the specific kind of the curable resin is not particularly limited as long as it has the above-mentioned characteristics. For example, those which can be cured to exhibit an adhesive property can include a resin comprising one or more thermally curable functional groups such as a glycidyl group, an isocyanate group, a hydroxy group, a carboxyl group or an amide group, or one or more functional groups capable of being cured by irradiation of an electromagnetic wave such as an epoxide group, a cyclic ether group, a sulfide group, an acetal group or a lactone group. Also, the specific kind of such a resin can include an acrylic resin, a polyester resin, an isocyanate resin or an epoxy resin, and the like, but is not limited thereto.

In the present application, as the curable resin, aromatic or aliphatic; or linear or branched epoxy resins can be used. In one embodiment of the present invention, an epoxy resin having an epoxy equivalent of 180 g/eq to 1,000 g/eq, which contains two or more functional groups, can be used. By using the epoxy resin having an epoxy equivalent in the above range, characteristics such as adhesion performance and glass transition temperature of the cured product can be effectively maintained. An example of such an epoxy resin can include one or a mixture of two or more of a cresol novolac epoxy resin, a bisphenol A type epoxy resin, a bisphenol A type novolak epoxy resin, a phenol novolak epoxy resin, a tetrafunctional epoxy resin, a biphenyl type epoxy resin, a triphenol methane type epoxy resin, an alkyl-modified triphenol methane epoxy resin, a naphthalene type epoxy resin, a dicyclopentadiene type epoxy resin or a dicyclopentadiene-modified phenol type epoxy resin.

In the present application, as the curable resin, an epoxy resin comprising a cyclic structure in a molecular structure can be used, and an epoxy resin comprising an aromatic group (for example, a phenyl group) can be used. When the epoxy resin comprises an aromatic group, the cured product has excellent thermal and chemical stability and simultaneously exhibits a low moisture absorption amount, whereby the reliability of the organic electronic device encapsulation structure can be improved. A specific example of the aromatic group-containing epoxy resin that can be used in the present invention can be one or a mixture of two or more of a biphenyl type epoxy resin, a dicyclopentadiene type epoxy resin, a naphthalene type epoxy resin, a dicyclopentadiene-modified phenol type epoxy resin, a cresol-based epoxy resin, a bisphenol-based epoxy resin, a xylol-based epoxy resin, a multifunctional epoxy resin, a phenol novolak epoxy resin, a triphenol methane type epoxy resin, and an alkyl-modified triphenol methane epoxy resin and the like, but is not limited thereto.

In addition, in one example, the encapsulation layer of the present application can comprise an active energy ray polymerizable compound which is highly compatible with the encapsulation resin and can form a specific cross-linked structure together with the encapsulation resin. In this case, the encapsulation resin can be a cross-linkable resin.

For example, the encapsulation layer of the present application can comprise, depending on the type of the encapsulation resin, a multifunctional active energy ray polymerizable compound that can be polymerized by irradiation of an active energy ray together with the encapsulation resin. The active energy ray polymerizable compound can mean a compound comprising two or more functional groups capable of participating in polymerization reaction by irradiation of an active energy ray, for example, functional groups containing an ethylenically unsaturated double bond such as an acryloyl group or a methacryloyl group, or functional groups such as an epoxy group or an oxetane group.

As the multifunctional active energy ray polymerizable compound, for example, a multifunctional acrylate (MFA) can be used.

Also, the active energy ray polymerizable compound can be included in an amount of 5 to 30 parts by weight, 5 to 25 parts by weight, 8 to 20 parts by weight, 10 to 18 parts by weight or 12 to 18 parts by weight, relative to 100 parts by weight of the encapsulation resin. The present application provides an encapsulation film having excellent endurance reliability even under severe conditions such as high temperature and high humidity in the above range.

The multifunctional active energy ray polymerizable compound which can be polymerized by irradiation of the active energy ray can be used without any limitation. For example, the compound can include 1,4-butanediol di(meth) acrylate, 1,3-butylene glycol di(meth)acrylate, 1,6-hexanediol di(meth)acrylate, 1,8-octanediol di(meth)acrylate, 1,12-dodecanediol di(meth)acrylate, neopentylglycoldi(meth) acrylate, dicyclopentanyl di(meth)acrylate, cyclohexane-1, 4-diol di(meth)acrylate, tricyclodecanedimethanol (meth) diacrylate, dimethyloldicyclopentane di(meth)acrylate, neopentylglycol-modified trimethylol propane di(meth) acrylate, adamantane di(meth)acrylate, trimethylolpropane tri(meth)acrylate, or a mixture thereof.

As the multifunctional active energy ray polymerizable compound, for example, a compound having a molecular weight of less than 1,000 and containing two or more functional groups can be used. In this case, the molecular weight can mean a weight average molecular weight or a typical molecular weight. The ring structure included in the multifunctional active energy ray polymerizable compound can be any one of a carbocyclic structure or a heterocyclic structure, or a monocyclic or polycyclic structure.

In an embodiment of the present application, the encapsulation layer can further comprise a radical initiator. The radical initiator can be a photoinitiator or a thermal initiator. The specific kind of the photoinitiator can be appropriately selected in consideration of curing rate and yellowing possibility, and the like. For example, benzoin-based, hydroxy ketone-based, amino ketone-based or phosphine oxide-based photoinitiators, and the like can be used, and specifically, benzoin, benzoin methyl ether, benzoin ethyl ether, benzoin isopropyl ether, benzoin n-butyl ether, benzoin isobutyl ether, acetophenone, dimethylamino acetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexylphenyl ketone, 2-methyl-1-[4-(methylthio)phenyl]-2-morpholino-propan-1-one, 4-(2-hydroxyethoxy)phenyl-2-(hydroxy-2-propyl) ketone, benzophenone, p-phenylbenzophenone, 4,4'-diethylamino-benzophenone, diclorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethyl-thioxanthone, 2,4-diethylthioxanthone, benzyl dimethyl ketal, acetophenone dimethyl ketal, p-dimethylaminobenzoic acid ester, oligo[2-hydroxy-2-methyl-1-[4-(1-methylvinyl)phenyl]propanone] and 2,4,6-trimethylbenzoyl-diphenyl-phosphine oxide, and the like can be used.

The radical initiator can be included in a ratio of 0.2 to 20 parts by weight, 0.5 to 18 parts by weight, 1 to 15 parts by weight, or 2 to 13 parts by weight, relative to 100 parts by weight of the active energy ray polymerizable compound. As a result, the reaction of the active energy ray polymerizable compound can be effectively induced and deterioration of the physical properties of the encapsulation layer composition due to the residual components after curing can be also prevented.

In an embodiment of the present application, the encapsulation layer of the encapsulation film can further comprise a curing agent depending on the kind of the resin component to be included. For example, it can further comprise a curing agent capable of reacting with the above-mentioned encapsulation resin to form a cross-linked structure or the like. In this specification, the term encapsulation resin and/or binder resin can be used in the same sense as the resin component.

The kind of the curing agent can be appropriately selected and used depending on the type of the resin component or the functional group contained in the resin.

In one example, when the resin component is an epoxy resin, the curing agent is a curing agent of the epoxy resin known in the art, and for example, one or two or more of an amine curing agent, an imidazole curing agent, a phenol curing agent, a phosphorus curing agent or an acid anhydride curing agent, and the like can be used, without being limited thereto.

In one example, as the curing agent, an imidazole compound which is solid at room temperature and has a melting point or a decomposition temperature of 80° C. or higher can be used. As such a compound, for example, 2-methylimidazole, 2-heptadecylimidazole, 2-phenylimidazole, 2-phenyl-4-methylimidazole or 1-cyanoethyl-2-phenylimidazole, and the like can be exemplified, but is not limited thereto.

The amount of the curing agent can be selected depending on composition of the composition, for example, the type or ratio of the encapsulation resin. For example, the curing agent can be included in an amount of 1 to 20 parts by weight, 1 to 10 parts by weight or 1 to 5 parts by weight, relative to 100 parts by weight of the resin component. However, the weight ratio can be changed depending on the type and ratio of the encapsulation resin or the functional group of the resin, or the cross-linking density to be implemented, and the like.

When the resin component is a resin which can be cured by irradiation of the active energy ray, for example, a cationic photopolymerization initiator can be used as the initiator.

As the cationic photopolymerization initiator, ionized cationic initiators of onium salt organometallic salt series, or nonionized cationic photopolymerization initiators of organic silane or latent sulfonic acid series can be used. As the initiator of the onium salt series, diaryliodonium salt, triarylsulfonium salt or aryldiazonium salt, and the like can be exemplified, as the initiator of the organometallic salt series, iron arene and the like can be exemplified, as the initiator of the organosilane series, o-nitrobenzyl triaryl silyl ether, triaryl silyl peroxide or acyl silane, and the like can be exemplified, and as the initiator of the latent sulfuric acid series, α-sulfonyloxy ketone or α-hydroxymethylbenzoin sulfonate, and the like can be exemplified, without being limited thereto.

In one example, as the cationic initiator, an ionized cationic photopolymerization initiator can be used.

In one example, the encapsulation layer can further comprise a tackifier, where the tackifier can be, preferably, a hydrogenated cyclic olefin polymer. As the tackifier, for example, a hydrogenated petroleum resin obtained by hydrogenating a petroleum resin can be used. The hydrogenated petroleum resin can be partially or fully hydrogenated and can be also a mixture of such resins. Such a tackifier can be selected to have good compatibility with the pressure-sensitive adhesive composition, excellent moisture barrier property, and low organic volatile components. A specific example of the hydrogenated petroleum resin can include a hydrogenated terpene resin, a hydrogenated ester resin or a hydrogenated dicyclopentadiene resin, and the like. The tackifier can have a weight average molecular weight of about 200 to 5,000. The amount of the tackifier can be appropriately adjusted as necessary. For example, according to one example, the amount of the tackifier can be included in a ratio of 5 to 100 parts by weight, 8 to 95 parts by weight, 10 to 93 parts by weight or 15 to 90 parts by weight, relative to 100 parts by weight of the resin component.

As described above, the encapsulation layer can further comprise a moisture adsorbent. In this specification, the term "moisture adsorbent" can mean a chemically reactive adsorbent capable of removing moisture or humidity, for example, through chemical reaction with the moisture or humidity that has penetrated the encapsulation film, as described below.

For example, the moisture adsorbent can be present in an evenly dispersed state in the encapsulation layer or the encapsulation film. Here, the evenly dispersed state can mean a state where the moisture adsorbent is present at the same or substantially the same density even in any portion of the encapsulation layer or the encapsulation film. The moisture adsorbent that can be used in the above can include, for example, a metal oxide, a sulfate or an organometallic oxide, and the like. Specifically, an example of the sulfate can include magnesium sulfate, sodium sulfate or nickel sulfate, and the like, and an example of the organometallic oxide can include aluminum oxide octylate and the like. Here, a specific example of the metal oxide can include phosphorus pentoxide ($P_2O_5$), lithium oxide ($Li_2O$), sodium oxide ($Na_2O$), barium oxide (BaO), calcium oxide (CaO) or magnesium oxide (MgO), and the like, and an example of the metal salt can include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate (Ti$(SO_4)_2$) or nickel sulfate ($NiSO_4$), a metal halogenide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto. As the moisture adsorbent which can be included in the encapsulation layer, one or two or more of the above-mentioned constitutions can be also used. In one example, when two or more are used as the moisture adsorbent, calcined dolomite and the like can be used.

Such a moisture adsorbent can be controlled to an appropriate size depending on applications. In one example, the average particle diameter of the moisture adsorbent can be controlled to 100 to 15000 nm, 500 nm to 10000 nm, 800 nm to 8000 nm, 1 μm to 7 μm, 2 μm to 5 μm, or 2.5 μm to 4.5 μm. The moisture adsorbent having a size within the above range has a reaction rate with moisture which is not too fast and thus is easy to store, and do not damage the element to be encapsulated, and effectively remove moisture, without interfering with the hydrogen adsorption process in relation to the bright spot inhibitor. Furthermore, in an embodiment of the present application, the ratio of the bright spot inhibitor particle diameter to the moisture adsorbent particle diameter can be in a range of 0.01 to 1.5 or 0.1 to 0.95. In this specification, the particle diameter can mean an average particle diameter, and can be measured by a known method with a D50 particle size analyzer. The present application can realize the moisture barrier property, which is the original function of the encapsulation film, and the reliability of the element as well as the bright spot prevention, by controlling the particle diameter ratio of the bright spot inhibitor and the moisture adsorbent present inside the film.

The amount of the moisture adsorbent is not particularly limited, which can be suitably selected in consideration of the desired blocking characteristics. In one example, the encapsulation film of the present application can have a weight ratio of the bright spot inhibitor to the moisture adsorbent in a range of 0.05 to 0.8 or 0.1 to 0.7. In the present application, the bright spot inhibitor is dispersed in the film in order to prevent the bright spots, but the bright spot inhibitor added to prevent the bright spots can be included at a specific content ratio with the moisture adsorbent, considering the moisture barrier property, which is an inherent function of the encapsulation film, and the reliability implementation of the element.

The encapsulation layer can also comprise a moisture blocker, if desired. In this specification, the term "moisture blocker" can mean a material which has free or low reactivity with moisture, but can physically block or hinder movement of moisture or humidity within the film. As the moisture blocker, for example, one or two or more of clay, talc, needle-like silica, plate-like silica, porous silica, zeolite, titania or zirconia can be used. In addition, the moisture blocker can be surface-treated with an organic modifier or the like to facilitate penetration of organic substances. As such an organic modifier, for example, dimethyl benzyl hydrogenated tallow quaternary ammonium, dimethyl hydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof, and the like can be used.

The amount of the moisture blocker is not particularly limited and can be suitably selected in consideration of the desired blocking characteristics.

In addition to the above-described constitutions, the encapsulation layer can comprise various additives depending on applications and the preparing process of the encapsulation film to be described below. For example, the encapsulation layer can comprise a curable material, a cross-linking agent, a filler or the like in an appropriate range of content depending on the intended physical properties.

When the encapsulation layer is formed of two or more layers, the second layer not contacting the organic electronic element can comprise the moisture adsorbent. For example, in the case of being formed in two or more layers, the layer contacting the organic electronic element in the encapsulation layer can comprise no moisture adsorbent or can comprise the moisture adsorbent in a small amount of less than 5 parts by weight or less than 4 parts by weight relative to 100 parts by weight of the encapsulation resin.

Specifically, the amount of the moisture adsorbent can be controlled in consideration of damage of the element and the like, considering that the encapsulation film is applied to the encapsulation of the organic electronic element. For example, the first layer contacting the element can comprise a small amount of moisture adsorbent, or can comprise no moisture adsorbent. In one example, the first layer of the encapsulation layer in contact with the element can comprise 0 to 20% of moisture adsorbent relative to the total mass of the moisture adsorbent included in the encapsulation film. In addition, the encapsulation layer which does not contact the element can comprise 80 to 100% of moisture adsorbent relative to the total mass of the moisture adsorbent included in the encapsulation film.

In an embodiment of the present application, the encapsulation film can further comprise a metal layer formed on the encapsulation layer. An exemplary embodiment is illustrated in FIG. 6. The metal layer of the present application as described above can have thermal conductivity of 50 W/m·K or more, 60 W/m·K or more, 70 W/m·K or more, 80 W/m·K or more, 90 W/m·K or more, 100 W/m·K or more, 110 W/m·K or more, 120 W/m·K or more, 130 W/m·K or more, 140 W/m·K or more, 150 W/m·K or more, 200 W/m·K or more, or 210 W/m·K or more. The upper limit of the thermal conductivity is not particularly limited, which can be 800 W/m·K or less. By having such high thermal conductivity, the heat generated at the bonding interface upon the metal layer bonding process can be released more quickly. Also, the heat accumulated during the operation of the organic electronic device is rapidly released because of the high thermal conductivity, whereby the temperature of the organic electronic device itself can be kept lower, and the occurrence of cracks and defects is reduced. The thermal conductivity can be measured at any temperature in the temperature range of 15 to 30° C.

The term "thermal conductivity" herein is a degree representing capability in which a material is capable of transferring heat by conduction, where the unit can be expressed by W/m·K. The unit represents the degree to which the material transfers heat at the same temperature and distance, which means a unit of heat (watt) to a unit of distance (meter) and a unit of temperature (Kelvin).

In an embodiment of the present application, the metal layer of the encapsulation film can be transparent and opaque. The metal layer can have a thickness in a range of 3 µm to 200 µm 10 µm to 100 µm 20 µm to 90 µm 30 µm to 80 or 40 µm to 75 µm. The present application can provide a thin film encapsulation film while realizing sufficient heat release effect by controlling the thickness of the metal layer. The metal layer can be a thin metal foil or a polymer base layer deposited with metal. The metal layer is not particularly limited as long as it is a material satisfying the above-described thermal conductivity and containing a metal. The metal layer can comprise any one from a metal, a metal oxide, a metal nitride, a metal carbide, a metal oxynitride, a metal oxyboride, or a combination thereof. For example, the metal layer can comprise an alloy in which one or more metal elements or nonmetal elements are added to one metal, and can comprise, for example, stainless steel (SUS). In addition, in one example, the metal layer can comprise iron, chromium, copper, aluminum, nickel, iron oxide, chromium oxide, silicon oxide, aluminum oxide, titanium oxide, indium oxide, tin oxide, indium tin oxide, tantalum oxide, zirconium oxide, niobium oxide or a combination thereof. The metal layer can be deposited by means of electrolysis, rolling, thermal evaporation, electron beam evaporation, sputtering, reactive sputtering, chemical vapor deposition, plasma chemical vapor deposition or electron cyclotron resonance source plasma chemical vapor deposition. In one example of the present application, the metal layer can be deposited by reactive sputtering.

Conventionally, a nickel-iron alloy (Invar) was usually used as an encapsulation film, but the nickel-iron alloy has a disadvantage that its price is high, its thermal conductivity is low, and its cutting property is poor. The present application provides an encapsulation film that prevents generation of bright spots of organic electronic devices, has excellent heat release characteristics, and implements process convenience due to magnetism, without using the nickel-iron alloy as the metal layer.

In an embodiment of the present application, the encapsulation layer can comprise a magnetic layer comprising magnetic particles. In this specification, the encapsulation layer comprising magnetic particles can be referred to as a magnetic layer. The magnetic layer can be formed between the second layer and the metal layer. An exemplary embodiment is illustrated in FIG. 7(a) The magnetic layer can be formed on the metal layer. An exemplary embodiment is illustrated in FIG. 7(b). When the magnetic layer is included, the bright spot inhibitor included in the encapsulation film can be present in the magnetic layer, but is not limited thereto. When the magnetic particles are included, the bright spot inhibitor can be included in an amount of 1 to 120 parts by weight, 5 to 109 parts by weight, 7 to 100 parts by weight, 9 to 92 parts by weight or 10 to 83 parts by weight relative to 100 parts by weight of the magnetic particles in the encapsulation film. The present application makes it possible to perform a process by magnetism by comprising a magnetic layer containing magnetic particles. Specifically, the encapsulation film according to the present application has sufficient magnetism, whereby the film can be fixed by a magnet, and accordingly, productivity is improved because no additional process is required to fix the film.

In one example, when the encapsulation layer comprises a magnetic layer, the encapsulation film can comprise a first layer (2), a second layer (4) comprising a bright spot inhibitor (3) and a moisture adsorbent (5), and an encapsulation layer comprising magnetic particles (7) (magnetic layer, 6), as shown in FIG. 2.

As long as the magnetic layer comprises magnetic particles, its material is not particularly limited. In one example, the magnetic layer can be a pressure-sensitive adhesive layer or an adhesive layer comprising a pressure-sensitive adhesive composition or an adhesive composition.

The magnetic layer can further comprise a binder resin. The material constituting the binder resin is not particularly limited. In one example, the binder resin can include an acrylic resin, an epoxy resin, a silicone resin, a fluorine resin, a urethane resin, a styrene resin, a polyolefin resin, a thermoplastic elastomer, a polyoxyalkylene resin, a polyester resin, a polyvinyl chloride resin, a polycarbonate resins, a polyphenylene sulfide resin, a polyamide resins or a mixture thereof, but is not limited thereto. The binder resin can have a glass transition temperature of less than 0° C., less than −10° C., less than −30° C., less than −50° C., or less than −60° C. Here, the glass transition temperature can be a glass transition temperature after curing, and in one embodiment, it can mean a glass transition temperature after irradiation with ultraviolet light of about 1 J/cm$^2$ or more; or a glass transition temperature after further performing thermosetting after ultraviolet irradiation.

In one example, as long as the magnetic particle has magnetism, its type is not particularly limited, which can be a material known in the art. For example, the magnetic particle can be Cr, Fe, Pt, Mn, Zn, Cu, Co, Sr, Si, Ni, Ba, Cs, K, Ra, Rb, Be, Y, or B, or an alloy thereof, or an oxide thereof, and in an embodiment of the present application, the magnetic particle can include Cr, Fe, $Fe_3O_4$, $Fe_2O_3$, $MnFe_2O_4$, $BaFe_{12}O_{19}$, $SrFe_{12}O_{19}$, $CoFe_2O_4$, CoPt, or FePt. In one example, the magnetic particle can have a size in a range of 10 nm to 200 μm, 90 nm to 180 μm, 120 nm to 130 μm, 280 nm to 110 μm, 450 nm to 100 μm, 750 nm to 90 μm, 950 nm to 70 μm, 990 nm to 30 μm, or 995 nm to 20 μm. The magnetic particles in powder form can form a magnetic layer together with the binder resin of the magnetic layer. In addition, in an embodiment of the present application, the binder resin can be included in an amount of 5 to 30 parts by weight, 8 to 28 parts by weight, 9 to 23 parts by weight, 10 to 18 parts by weight, or 11 to 14 parts by weight, relative to 100 parts by weight of the magnetic particles. As the binder resin and the magnetic particles are included in the above ratio, the film can be fixed by the magnet with sufficient magnetism, and it is possible to provide a film having the desired high reliability in terms of bright spot prevention and moisture barrier as described above. On the other hand, particles having magnetism, bright spot prevention performance and/or moisture adsorption performance together can be present inside the encapsulation film of the present application, and in this case, the particles can function as all the bright spot inhibitor, magnetic particles and/or moisture adsorbent. Furthermore, in the present application, when two or more of the particles are present, the particles having lower adsorption energy can be defined as the bright spot inhibitor.

In one example, the magnetic layer can have a thickness in a range of 5 μm to 200 μm, 10 μm to 150 μm, 13 μm to 120 μm, 18 μm to 90 μm, 22 μm to 70 μm, or 26 μm to 50 μm. The present application can provide a thin film encapsulation film while giving sufficient magnetic properties by controlling the thickness of the magnetic layer in the above range.

The encapsulation film can further comprise a base film or a release film (hereinafter, can be referred to as a "first film"), which can have a structure in which the encapsulation layer is formed on the base or release film. Also, the structure can further comprise a base or release film (hereinafter, can be referred to as a "second film") formed on the metal layer.

The specific kind of the first film that can be used in the present application is not particularly limited. In the present application, for example, a general polymer film in this field can be used as the first film. In the present application, for example, as the base or release film, a polyethylene terephthalate film, a polytetrafluoroethylene film, a polyethylene film, a polypropylene film, a polybutene film, a polybutadiene film, a polyvinyl chloride film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used. In addition, a suitable mold release treatment can be performed on one side or both sides of the base film or release film of the present application. As an example of the releasing agent used in the releasing treatment of the base film, alkyd series, silicone series, fluorine series, unsaturated ester series, polyolefin series or wax series, and the like can be used, and among them, a releasing agent of alkyd series, silicone series or fluorine series is preferably used in terms of heat resistance, without being limited thereto.

In the present application, the thickness of the base film or release film (first film) as above is not particularly limited, which can be appropriately selected depending on the application to which it is applied. For example, in the present application, the thickness of the first film can be 10 μm to 500 μm, preferably, 20 μm to 200 μm or so. If the thickness is less than 10 μm, deformation of the base film can easily occur during the manufacturing process, whereas if it exceeds 500 μm, the economic efficiency is low.

The thickness of the encapsulation layer included in the encapsulation film of the present application is not particularly limited, which can be appropriately selected in accordance with the following conditions in consideration of the application to which the film is applied. The thickness of the encapsulation layer can be 5 μm to 200 μm, preferably, 5 μm to 100 μm or so. The thickness of the encapsulation layer can be the entire thickness of the multi-layered encapsulation layer. If the thickness of the encapsulation layer is less than 5 μm, sufficient moisture blocking ability cannot be exhibited, whereas if it exceeds 200 μm, it is difficult to secure processability, the thickness expansion due to moisture reactivity is large, so that the deposited film of the organic light emitting element can be damaged, and the economic efficiency is low.

The present application also relates to an organic electronic device. As shown in FIG. 5, the organic electronic device can comprise a substrate (21); an organic electronic element (23) formed on the substrate (21); and the above-described encapsulation film (1) for encapsulating the organic electronic element (23). The encapsulation film can encapsulate the top side, for example, all the upper part and the side surface, of the organic electronic element formed on the substrate. The encapsulation film can comprise an encapsulation layer comprising a pressure-sensitive adhesive composition or an adhesive composition in a cross-linked or cured state. Furthermore, the organic electronic device can be formed by encapsulating the encapsulation layer so as to contact the entire surface of the organic electronic element formed on the substrate. The organic electronic device also can include a metal layer (8) formed on the encapsulation layer (4), an exemplary embodiment of which is illustrated in FIG. 8.

In an embodiment of the present application, the organic electronic element can comprise a pair of electrodes, an organic layer comprising at least a light emitting layer, and a passivation layer. Specifically, the organic electronic element can comprise a first electrode layer, an organic layer formed on the first electrode layer and comprising at least a light emitting layer, and a second electrode layer formed on the organic layer, and can comprise a passivation layer for protecting the electrode on the second electrode layer and the organic layer. The first electrode layer can be a transparent electrode layer or a reflective electrode layer, and the second electrode layer can also be a transparent electrode layer or a reflective electrode layer. More specifically, the organic electronic element can comprise a transparent electrode layer formed on a substrate, an organic layer formed on the transparent electrode layer and comprising at least a light emitting layer, and a reflective electrode layer formed on the organic layer.

Here, the organic electronic element can be, for example, an organic light emitting element.

The passivation layer can comprise an inorganic layer and an organic layer. In one embodiment, the inorganic layer can be one or more metal oxides or nitrides selected from the group consisting of Al, Zr, Ti, Hf, Ta, In, Sn, Zn and Si. The inorganic layer can have a thickness of 0.01 μm to 50 μm or 0.1 μm to 20 μm or 1 μm to 10 μm. In one example, the inorganic layer of the present application can be an inorganic material containing no dopant, or can be an inorganic material containing a dopant. The dopant which can be doped can be one or more elements selected from the group consisting of Ga, Si, Ge, Al, Sn, Ge, B, In, Tl, Sc, V, Cr, Mn, Fe, Co and Ni, or an oxide of the element, but is not limited thereto. The organic layer is distinguished from the organic layer containing at least a light emitting layer in that it does not include a light emitting layer, and can be an organic deposition layer containing an epoxy compound.

The inorganic layer or the organic layer can be formed by chemical vapor deposition (CVD). For example, as the inorganic layer, silicon nitride (SiNx) can be used. In one example, silicon nitride (SiNx) used as the inorganic layer can be deposited to a thickness of 0.01 to 50 μm. In one example, the organic layer can have a thickness in a range of 2 μm to 20 μm, 2.5 μm to 15 μm, and or 2.8 μm to 9 μm.

The present application also provides a method for preparing an organic electronic device. The preparing method can comprise a step of applying the above-described encapsulation film to a substrate, on which an organic electronic element is formed, so as to cover the organic electronic element. In addition, the preparing method can comprise a step of curing the encapsulation film. The curing step of the encapsulation film can mean curing of the encapsulation layer, which can proceed before or after the encapsulation film covers the organic electronic element.

In this specification, the term "curing" can mean that the pressure-sensitive adhesive composition of the present invention forms a cross-linked structure through heating or UV irradiation processes, and the like to be produced in the form of a pressure-sensitive adhesive. Alternatively, it can mean that the adhesive composition is solidified and attached as an adhesive.

Specifically, the organic electronic element can be formed by forming a transparent electrode on a glass or polymer film used as a substrate by a method such as vacuum evaporation or sputtering, forming a luminescent organic material layer composed of, for example, a hole transporting layer, a light emitting layer and an electron transporting layer, and the like on the transparent electrode, and then further forming an electrode layer thereon. Subsequently, the encapsulation layer of the encapsulation film is placed to cover the entire surface of the organic electronic element of the substrate subjected to the above process.

Advantageous Effects

The encapsulation film of the present application can be applied to sealing or encapsulation of an organic electronic device such as an OLED. The film allows forming a structure capable of blocking moisture or oxygen introduced into an organic electronic device from the outside, and can prevent occurrence of bright spots of the organic electronic device.

BRIEF DESCRIPTION OF DRAWINGS

FIGS. 1(a), 1(b), 2-4, 6, 7(a), and 7(b) are cross-sectional views showing an encapsulation film according to one example of the present application.

FIGS. 5 and 8 are cross-sectional views showing an organic electronic device according to one example of the present application.

EXPLANATION OF REFERENCE NUMERALS

1: encapsulation film
2, 4, 6: encapsulation layer
3: bright spot inhibitor
5: moisture absorbent
8: metal layer
9: magnetic layer
7: magnetic particle
21: substrate
23: organic electronic element

BEST MODE

Hereinafter, the present invention will be described in more detail through examples according to the present invention and comparative examples not according to the present invention, but the scope of the present invention is not limited by the following examples.

EXAMPLE 1

Production of Encapsulation Layer

To prepare a first encapsulation layer solution, a solution (solid content 33%), in which 180 g of a butyl rubber resin (BT-20, Sunwoo Chemtech) and 60 g of a DCPD (dicyclopentadiene) petroleum resin (SU5270, Sunwoo Chemtech) were diluted with toluene, was prepared and then the solution was homogenized. 10 g of a multifunctional acrylate (trimethylolpropane triacrylate, Miwon) and 3 g of photoinitiator (Irgacure 819, Ciba) were introduced to the homogenized solution, homogenized and then stirred at a high speed for 1 hour to prepare the first encapsulation layer solution.

To prepare a second encapsulation layer solution, a calcined dolomite (average particle diameter 3 μm) solution (solid content 50%) was prepared as a moisture adsorbent. Also, separately, a solution (solid content 50%), in which 140 g of a polyisobutylene resin (weight average molecular weight 450,000), 14 g of Ni particles (particle diameter of about 300 nm) as a bright spot inhibitor and 60 g of a hydrogenated dicyclopentadiene resin (softening point 125° C.) as a tackifier were diluted with toluene, was prepared, and then the solution was homogenized. 10 g of a photo-curing agent (TMPTA, Miwon) and 15 g of a photoinitiator (Irgacure 819, Ciba) were introduced to the homogenized solution and homogenized, and then 100 g of the moisture adsorbent solution was introduced thereto and then stirred at a high speed for 1 hour to prepare the second encapsulation layer solution.

The above-prepared encapsulation layer solutions were applied to the release surface of a releasing PET using a comma coater separately from each of the first encapsulation layer and the second encapsulation layer and dried in a dryer at 130° C. for 3 minutes to form encapsulation layers each having a thickness of 50 µm, and then two layers were laminated.

Production of Encapsulation Film

The release-treated PET attached to the second encapsulation layer of the encapsulation layer was peeled off and the second encapsulation layer of the encapsulation layer was laminated on the previously prepared metal layer (aluminum foil, thickness 70 µm) at 70° C. by a roll-to-roll process to produce an encapsulation film such that the second encapsulation layer is in contact with the metal layer.

The produced encapsulation film was cut into a square sheet shape with a knife cutter through a wood cutting machine to produce a film for encapsulating an organic electronic element.

EXAMPLES 2 TO 9 AND COMPARATIVE EXAMPLES 1 TO 5

An encapsulation film was produced in the same manner as in Example 1, except that the bright spot inhibitor was changed as shown in Table 1.

TABLE 1

| | Bright spot inhibitor | | | | |
|---|---|---|---|---|---|
| | | | | Adsorption energy (eV) | |
| | Type | Particle diameter (nm) | Content (g) | $NH_3$ | H |
| Example 1 | Ni | 300 | 14 | −0.54 | −2.624 |
| Example 2 | Ni | 300 | 6 | −0.54 | −2.624 |
| Example 3 | In | 300 | 14 | — | −5.084 |
| Example 4 | Li | 300 | 14 | — | −3.42 |
| Example 5 | Pt | 300 | 14 | — | −2.932 |
| Example 6 | $SiO_2$ | 300 | 14 | −3.545 | −5.021 |
| Example 7 | Graphite | 300 | 14 | — | −3.927 |
| Example 8 | Ti | 300 | 14 | −0.879 | −3.207 |
| Example 9 | NiO | 300 | 14 | −0.773 | −2.072 |
| Comparative Example 1 | Absence | — | — | — | — |
| Comparative Example 2 | Na | 500 | 60 | −0.319 | 0.122 |
| Comparative Example 3 | K | 500 | 60 | — | 0.046 |
| Comparative Example 4 | Cs | 500 | 60 | — | 0.027 |
| Comparative Example 5 | Ni | 50 µm | 60 | −0.54 | −2.624 |

EXPERIMENTAL EXAMPLE 1

Calculation of Adsorption Energy

The adsorption energy of the bright spot inhibitors used in the examples and comparative examples for outgases was calculated through electronic structure calculation based on the density functional theory. After making a two-dimensional slab structure in which the closest packed filling surface of a bright spot inhibitor having a crystalline structure is exposed on the surface and then performing structure optimization, and performing the structure optimization for a structure that the bright spot-causing molecules are adsorbed on the surface of this vacuum state, the value obtained by subtracting the total energy of the bright spot-causing molecules from the total energy difference of these two systems was defined as the adsorption energy. For the total energy calculation about each system, a revised-PBE function as a function of GGA (generalized gradient approximation) series was used as exchange-correlation to simulate the interaction between electrons and electrons, the used cutoff of the electron kinetic energy was 500 eV and only the gamma point corresponding to the origin of the reciprocal space was included and calculated. A conjugate gradient method was used to optimize the atomic structure of each system and iterative calculation was performed until the interatomic force was 0.01 eV/A or less. A series of calculation was performed through VASP as a commercially available code.

EXPERIMENTAL EXAMPLE 2

Occurrence of Dark Spots or Bright Spots

After an organic electronic element was deposited on a glass substrate, the encapsulation films produced in the examples and comparative examples were each laminated onto the element using a vacuum laminator under the conditions of 50° C., a vacuum degree of 50 mTorr and 0.4 MPa to produce an organic electronic panel.

The above-produced panel is placed in a constant temperature and humidity chamber at 85° C. and 85%, and stored. After 1000 hours, it is taken out and turned on to check whether the bright spots are generated or whether the element shrinks. It was classified as ⊚ when bright spots and element shrinkage did not occur, as O when bright spots and element shrinkage occurred very little, and as X when bright spot defects occurred and element shrinkage occurred.

TABLE 2

| | Bright spot occurrence |
|---|---|
| Example 1 | ⊚ |
| Example 2 | O |
| Example 3 | ⊚ |
| Example 4 | ⊚ |
| Example 5 | ⊚ |
| Example 6 | ⊚ |
| Example 7 | ⊚ |
| Example 8 | ⊚ |
| Example 9 | ⊚ |
| Comparative Example 1 | X |
| Comparative Example 2 | X |
| Comparative Example 3 | X |
| Comparative Example 4 | X |
| Comparative Example 5 | X |

The invention claimed is:
1. An encapsulation film for an organic electronic element, comprising:
at least two encapsulation layers, wherein a first encapsulation layer is in contact with the organic electronic element, and a second encapsulation layer is not in contact with the organic electronic element, and
the second encapsulation layer comprises a bright spot inhibitor having adsorption energy of 0ev or less for outgases as calculated by the density functional theory, wherein the bright spot inhibitor comprises particles selected from among Li, Ni, Rb, Be, Mg, Ca, Sr, Ba,

Zn, In, Pd, Cr, Si, nickel oxide, titanium nitride, titanium-based alloy of iron-titanium, manganese-based alloy of iron-manganese, magnesium-based alloy of magnesium-nickel, rare earth-based alloy, carbon nanotubes, and graphite; and a metal layer comprising iron, chromium, copper, aluminum, nickel or a combination thereof on the second encapsulation layer, wherein at least one encapsulation layer comprises a moisture adsorbent, and a weight ratio of the bright spot inhibitor to the moisture adsorbent is in a range of 0.05 to 0.8.

2. The encapsulation film according to claim 1, wherein the outgas comprises H atoms, $H_2$ molecules or $NH_3$.

3. The encapsulation film according to claim 1, wherein the first encapsulation layer:

comprises the bright spot inhibitor in an amount of 15% or less based on the mass of the entire bright spot inhibitor in the encapsulation film; or does not comprise the bright spot inhibitor.

4. The encapsulation film according to claim 1, wherein at least one encapsulation layer comprises an encapsulation resin.

5. The encapsulation film according to claim 1, wherein the moisture adsorbent comprises a chemically reactive adsorbent.

6. The encapsulation film according to claim 1, wherein the moisture adsorbent has a particle diameter in a range of 100 to 15000 nm.

7. The encapsulation film according to claim 1, wherein the bright spot inhibitor has a particle diameter in a range of 10 nm to 30 μm.

8. The encapsulation film according to claim 1, wherein the bright spot inhibitor is present in an amount of 3 to 150 parts by weight relative to 100 parts by weight of the resin component in the encapsulation layer.

9. The encapsulation film according to claim 1, wherein the first encapsulation layer encapsulates the entire surface of an organic electronic element formed on a substrate.

10. The encapsulation film according to claim 1, wherein the metal layer has thermal conductivity of 50 to 800 W/m·K.

11. An organic electronic device, comprising:
a substrate;
an organic electronic element formed on the substrate; and
the encapsulation film, according to claim 1, for encapsulating the organic electronic element.

12. The organic electronic device according to claim 11, wherein the organic electronic element comprises a pair of electrodes, an organic layer comprising at least a light emitting layer, and a passivation layer.

13. An encapsulation film for an organic electronic element, comprising:

at least two encapsulation layers, wherein a first encapsulation layer is in contact with the organic electronic element, and a second encapsulation layer is not in contact with the organic electronic element, and the second encapsulation layer comprises a bright spot inhibitor having adsorption energy of 0ev or less for outgases as calculated by the density functional theory;

a metal layer on the second encapsulation layer; and wherein the encapsulation film further comprises a magnetic layer comprising magnetic particles and the magnetic layer is between the second encapsulation layer and the metal layer, or is on the metal layer.

14. The encapsulation film according to claim 13, wherein the magnetic layer comprises a binder resin.

15. The encapsulation film according to claim 14, wherein the binder resin is present in an amount of 5 to 30 parts by weight relative to 100 parts by weight of the magnetic particles.

16. An organic electronic device, comprising:
a substrate;
an organic electronic element formed on the substrate; and
the encapsulation film, according to claim 13, for encapsulating the organic electronic element.

17. The organic electronic device according to claim 16, wherein the organic electronic element comprises a pair of electrodes, an organic layer comprising at least a light emitting layer, and a passivation layer.

18. A method for preparing an organic electronic device, comprising applying the encapsulation film according to claim 13 to a substrate, on which an organic electronic element is formed, so as to cover the organic electronic element.

19. A method for preparing an organic electronic device, comprising applying the encapsulation film according to claim 1 to a substrate, on which an organic electronic element is formed, so as to cover the organic electronic element.

* * * * *